(12) United States Patent
Takano et al.

(10) Patent No.: US 10,777,485 B2
(45) Date of Patent: Sep. 15, 2020

(54) SEMICONDUCTOR DEVICE

(71) Applicant: TOYOTA JIDOSHA KABUSHIKI KAISHA, Toyota-shi, Aichi (JP)

(72) Inventors: Yuya Takano, Nishio (JP); Fumiki Tanahashi, Miyoshi (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 0 days.

(21) Appl. No.: 16/375,976

(22) Filed: Apr. 5, 2019

(65) Prior Publication Data

US 2019/0318981 A1 Oct. 17, 2019

(30) Foreign Application Priority Data

Apr. 12, 2018 (JP) ................. 2018-077017

(51) Int. Cl.
*H01L 23/40* (2006.01)
*H01L 23/473* (2006.01)

(52) U.S. Cl.
CPC ........ *H01L 23/4006* (2013.01); *H01L 23/473* (2013.01); *H01L 2023/4087* (2013.01)

(58) Field of Classification Search
CPC combination set(s) only.
See application file for complete search history.

(56) References Cited

U.S. PATENT DOCUMENTS

| | | | | |
|---|---|---|---|---|
| 2001/0033477 A1* | 10/2001 | Inoue | ................. | H01L 23/4006 361/718 |
| 2012/0001341 A1* | 1/2012 | Ide | ................. | H01L 23/473 257/773 |
| 2016/0064304 A1* | 3/2016 | Takano | ................. | H01L 23/473 361/699 |
| 2016/0064305 A1* | 3/2016 | Kakiuchi | ................. | H01L 23/473 361/699 |
| 2016/0079145 A1* | 3/2016 | Nakagawa | ................. | H05K 7/20927 361/699 |
| 2016/0329264 A1* | 11/2016 | Ekwall | ................. | H01L 23/4006 |

FOREIGN PATENT DOCUMENTS

| | | |
|---|---|---|
| JP | 2007-166820 A | 6/2007 |
| JP | 2009-212137 A | 9/2009 |
| JP | 2012-238681 A | 12/2012 |
| JP | 2016-051874 A | 4/2016 |

\* cited by examiner

*Primary Examiner* — Michelle Mandala
*Assistant Examiner* — Jordan M Klein
(74) *Attorney, Agent, or Firm* — Sughrue Mion, PLLC

(57) ABSTRACT

A semiconductor device may include coolers, semiconductor modules, and a pair of connecting pipes. The coolers are arranged in a line and each of which includes a first flow path. Each of the semiconductor modules is interposed between a corresponding pair of the coolers. Each of the connecting pipes communicates with the adjacent coolers. A pair of coolant holes may be provided at one of the coolers located at one end in the stacking direction. A pair of second flow paths may extend respectively from the coolant holes to one of the coolers located at other end in the stacking direction. A bolt-head retainer and an internally threaded portion may be provided in each second flow path, the bolt-head retainer retaining a head of a bolt, and the internally threaded portion fixing the bolt. The coolers between the bolt-lead retainers and the internally threaded portions are fixed by the bolts.

3 Claims, 5 Drawing Sheets

SEMICONDUCTOR DEVICE

CROSS-REFERENCE TO RELATED APPLICATION

This application claims priority to Japanese Patent Application No. 2018-077017 filed on Apr. 12, 2018, the contents of which are hereby incorporated by reference into the present application.

TECHNICAL FIELD

The teaching disclosed herein relates to a semiconductor device in which a plurality of coolers are arranged in a line and each of semiconductor modules is interposed between a corresponding pair of the coolers adjacent each other.

Each of Japanese Patent Application Publication No. 2007-66820 (Patent Literature 1) and Japanese Patent Application Publication No. 2012-238681 (Patent Literature 2) describes a semiconductor device including a plurality of coolers arranged in a line, and semiconductor modules each of which is interposed between a corresponding pair of the coolers adjacent to each other. Each of the semiconductor modules is cooled from its both sides by a coolant flowing in the corresponding pair of the coolers. To increase cooling efficiency, the semiconductor device is pressed in a stacking direction of the coolers and the semiconductor modules. The semiconductor device in Patent Literature 1 has a compressed spring inserted between a casing and a stack of the coolers and the semiconductor modules, and is pressed by a force of the compressed spring in the stacking direction.

In the semiconductor device in Patent Literature 2, tabs are respectively provided at both ends of each of the coolers. The tabs are provided at both ends of each cooler in a direction intersecting the stacking direction of the coolers and the semiconductor modules. The coolers are fixed to each other by bolts penetrating the tabs in the stacking direction. The semiconductor device is pressed by the bolts in the stacking direction.

Moreover, Japanese Patent Application Publication No. 2009-212137 (Patent Literature 3) describes a semiconductor device in which a pair of coolers interposes a semiconductor module therebetween. The pair of coolers is fixed by bolts penetrating the coolers in their stacking direction. The bolts penetrate a coolant flow path in each of the coolers. The semiconductor device in Patent Literature 3 is also pressed by the bolts in the stacking direction.

SUMMARY

The semiconductor device in Patent Literature 1 requires a space for disposing the leaf spring. The semiconductor device in Patent Literature 2 has its size increased due to the tabs. The semiconductor device in Patent Literature 3 is provided with holes in each cooler through which the bolts penetrate, and thus requires gaskets (or O rings) for sealing gaps between the bolts and the holes. The teaching disclosed herein relates to improvements in a semiconductor device in which pairs of coolers each of which interposes a semiconductor module therebetween are bolted in their stacking direction.

A semiconductor device disclosed herein may comprise a plurality of coolers arranged in a line, semiconductor modules, and a pair of connecting pipes. Each of the coolers may include a first flow path through which a coolant flows. Each of the semiconductor modules may be interposed between a corresponding pair of the coolers adjacent to each other. Each of the pair of connecting pipes may communicate with the first flow paths in the coolers adjacent to each other. The pair of connecting pipes may be located respectively at both sides of the semiconductor modules in a direction intersecting a stacking direction of the coolers and the semiconductor modules. A pair of coolant holes may be provided at one of the coolers located at one end in the stacking direction, and each of the coolant holes may overlap corresponding one of the pair of connecting pipes in a view along the stacking direction. A pair of second flow paths may extend respectively from the coolant holes to one of the coolers located at other end in the stacking direction. A bolt-head retainer and an internally threaded portion may be provided in each of the second flow paths. Each of the bolt-head retainers has a bolt inserted therein and retains a head of the bolt, and each of the internally threaded portions fixes the bolt. The coolers between the bolt-head retainers and the internally threaded portions may be fixed by the bolts. The coolers and the semiconductor modules are pressed against each other by a fastening load of the bolts.

In the semiconductor device disclosed herein, each of the second flow paths is provided with the bolt-head retainer and the internally threaded portion. Therefore, the bolts are entirely accommodated in the second flow paths, fix the coolers to each other in the second flow paths, and apply pressure to the coolers and the semiconductor modules. The semiconductor device disclosed herein does not require the tabs described in Patent Literature 2. Moreover, the bolts pass through the coolers in the second flow paths. Therefore, there is no need to newly provide bolt holes in the coolers for allowing the bolts to pass therethrough, and thus there is no need to seal gaps between the bolts and the bolt holes as in the semiconductor device in Patent Literature 3.

The semiconductor device disclosed herein may be of a type in which all of the coolers are fixed to each other by the bolts, or may be of a type in which only some of the coolers are fixed to each other by the bolts.

In the semiconductor device disclosed herein, a compressed spring may be interposed between each of the bolt-head retainers and corresponding one of the heads of the bolts. Even when the bolts are somewhat loosened, the compressed springs can maintain the force to press the plurality of coolers in the stacking direction.

The details and further improvements of the teaching disclosed herein will be described in the following "DETAILED DESCRIPTION".

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Figure 1:
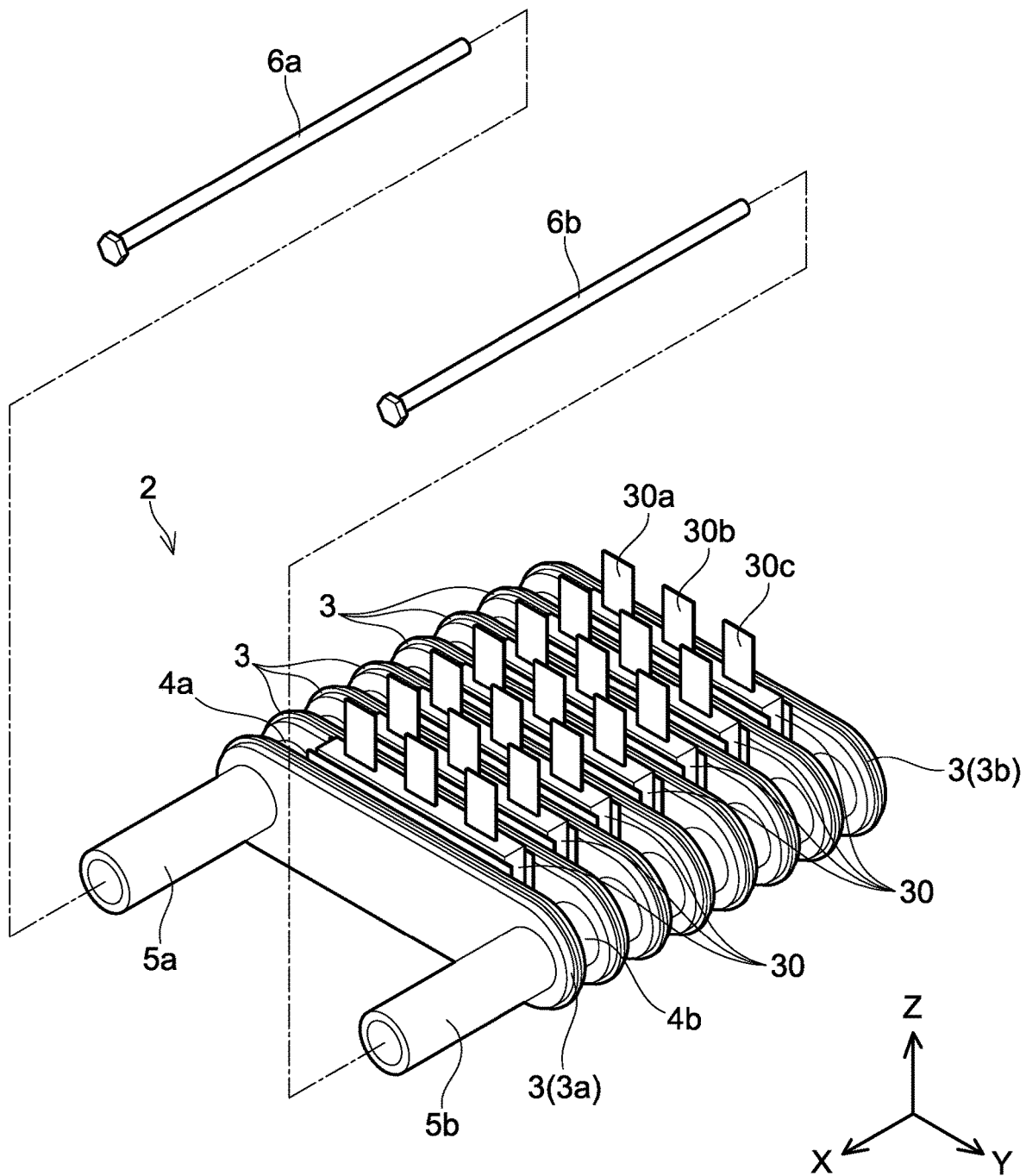
FIG. 1 is a perspective view of a semiconductor device in an embodiment (with bolts removed).
Figure 2:
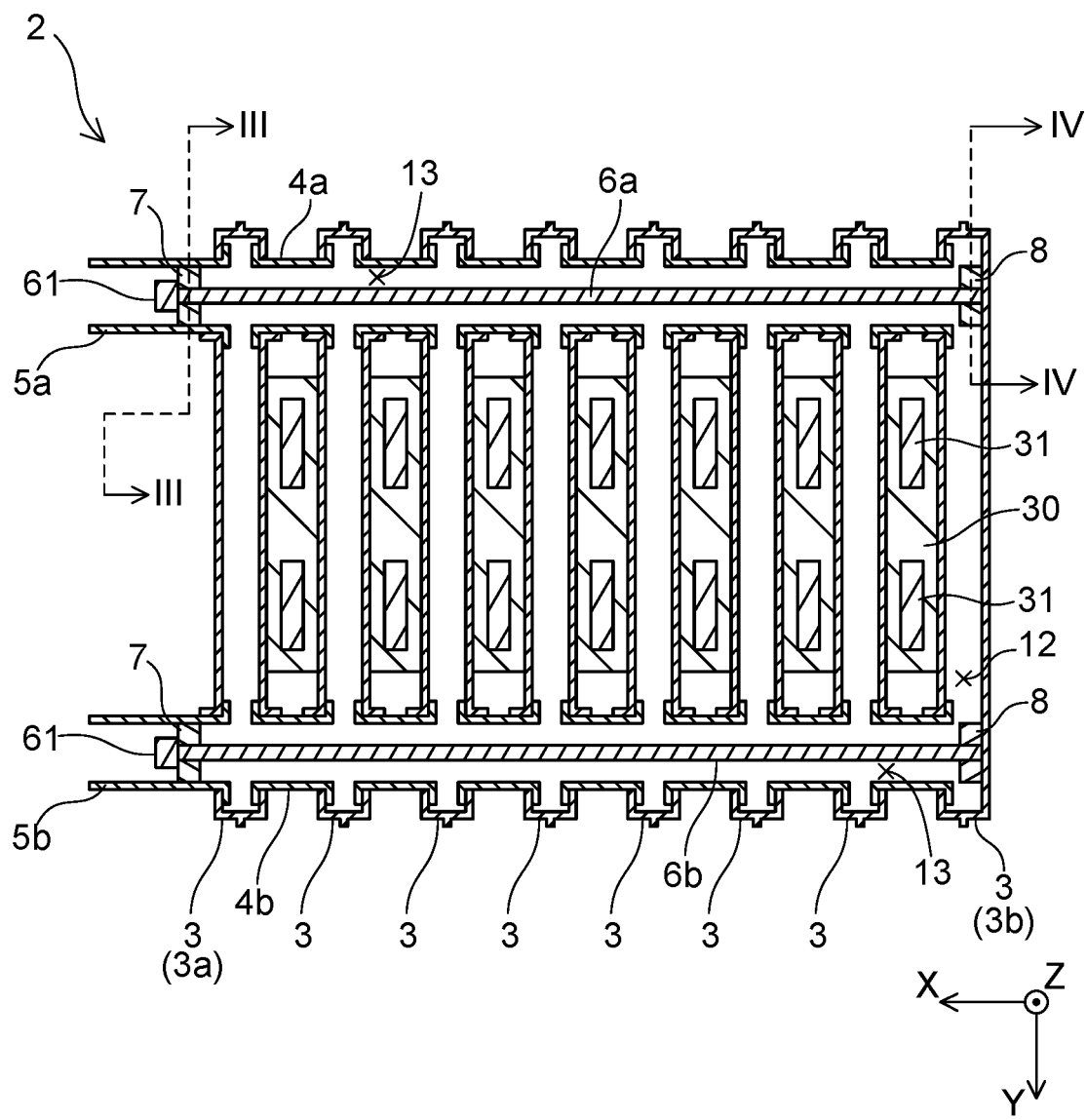
FIG. 2 is a cross-sectional view of the semiconductor device along an XY-plane.

With reference to the drawings, a semiconductor device 2 in an embodiment will be described. FIG. 1 shows a perspective view of the semiconductor device 2. FIG. 2 shows a cross-sectional view of the semiconductor device 2 along an XY-plane in a coordinate system in FIG. 1. The semiconductor device 2 is a device in which a plurality of semiconductor modules 30 and a plurality of coolers 3 are bound by bolts 6a, 6b. FIG. 1 shows a state in which the bolts 6a, 6b (which will be described later) are removed. The bolts 6a, 6b are respectively inserted into coolant holes 5a, 5b (will be described later), and fix the plurality of coolers.

Each of the semiconductor modules 30 houses two transistors 31 connected in series (see FIG. 2). In FIG. 2, the reference signs 30, 31 are given only to the semiconductor module located at a right end, and are omitted for the remaining semiconductor modules. A positive terminal 30a, a negative terminal 30b, and an intermediate terminal 30c extend from one surface of each of the semiconductor modules 30. The positive terminal 30a, the negative terminal 30b, and the intermediate terminal 30c are electrically conductive respectively with a positive electrode, a negative electrode, and a midpoint of the series connection of the two transistors 31. In FIG. 1, the reference signs 30a to 30c are given only to the terminals of the semiconductor module 30 located at the right end, and are omitted for the terminals of the remaining semiconductor modules. The semiconductor device 2, which includes the plurality of semiconductor modules 30 each housing the series connection of the transistors, is used as a main component of an inverter or a voltage converter, for example.

The plurality of coolers 3 is arranged in a line in an X direction in the drawings, and each of the semiconductor modules 30 is interposed between a corresponding pair of the coolers 3 adjacent to each other. In other words, the coolers 3 and the semiconductor modules 30 are alternately stacked one by one. For convenience of explanation, a reference sign 3a is used for indicating the cooler 3 located at a left end in FIG. 2, and a reference sign 3b is used for indicating the cooler 3 located at the right end in FIG. 2.

Each of the coolers 3 includes a flow path (a first flow path 12) through which a coolant passes. In FIG. 2, the reference sign 12 is given only to the first flow path in the cooler 3b located at the right end, and is omitted for the first flow paths in the remaining coolers. The coolers 3 adjacent to each other are connected by a pair of connecting pipes 4a, 4b. In FIGS. 1 and 2, the reference signs 4a, 4b are given only to the connecting pipes located at the left end, and are omitted for the remaining connecting pipes. Each pair of the connecting pipes 4a, 4b communicates with the first flow paths in the adjacent coolers 3.

The connecting pipes 4a, 4b are located respectively at both sides of the semiconductor modules 30 in a direction (a Y direction in the drawings) intersecting a stacking direction (the X direction in the drawings) of the coolers 3 and the semiconductor modules 30. The stacking direction (the X direction in the drawings) of the coolers 3 and the semiconductor modules 30 may hereinafter be simply termed "stacking direction".

The coolant holes 5a, 5b are provided at the cooler 3a located at one end in the stacking direction. The coolant hole 5a is provided to overlap the connecting pipes 4a in a view along the stacking direction. The coolant hole 5b is provided to overlap the connecting pipes 4b in a view along the stacking direction. A second flow path 13 is provided so as to extend straight from the coolant holes 5a (5b) to the cooler 3b located at the other end in the stacking direction, through the plurality of connecting pipes 4a (4b) and the coolers 3. Each of the second flow paths 13 communicates with the first flow paths 12 in the coolers 3. Although described in detail later, a bolt-head retainer 7 is provided in each of the coolant holes 5a, 5b. The bolt-head retainers 7 do not close the second flow paths 13. Moreover, an internally threaded portion 8 is provided at a right end of each of the second flow paths 13. The internally threaded portions 8 do not close the second flow paths 13, either.

The semiconductor device 2 cools the plurality of semiconductor modules 30 in a concentrated manner. A cooling structure of the semiconductor device 2 will be described. The coolant holes 5a, 5b are connected to a coolant circulation device, which is not shown. A coolant is supplied from the coolant circulation device through one of the coolant holes, namely, the coolant hole 5a. The coolant is distributed to all of the coolers 3 (the first flow paths 12) through the second flow path 13 at a connecting pipes 4a side. While passing through the first flow paths 12, the coolant absorbs heat from the semiconductor modules 30 adjacent to the coolers 3. The coolant that has absorbed heat returns to the coolant circulation device through the second flow path 13 at a connecting pipes 45 side and the coolant hole 5b. Since each of the semiconductor modules 30 is cooled from its both sides, the semiconductor device 2 has good cooling performance for the semiconductor modules 30. The coolant is a liquid, and is typically water or an anti-freeze solution.

To improve heat-transfer efficiency from the semiconductor modules 30 to the coolant, the semiconductor modules 30 and the coolers 3 are preferably kept in contact strongly with one another. In the semiconductor device 2, the semiconductor modules 30 and the coolers 3 are bound by the bolts 6a, 6b, and are pressed in the stacking direction thereby. The bolts 6a, 6b are entirely accommodated in the second flow paths 13, respectively. Therefore, there is no need to ensure space for the bolts outside the coolers 3, which provides good space efficiency. Moreover, the bolts 6a, 6b penetrate the coolers 3 through the second flow paths 13, respectively. In the semiconductor device 2, there is no need to newly provide holes, through which the bolts 6a, 6b penetrate, in outer walls of the coolers 3. In other words, the semiconductor device 2 does not need to newly include sealing means for the bolts 6a, 6b.

An attachment structure for the bolts 6a, 6b will be described. The bolt-head retainer 7 that has the bolt 6a (6b) inserted therein and retain a head 61 of the bolt 6a (6b) is provided in the coolant hole 5a (5b), namely, in the second flow path 13. Moreover, the internally threaded portion 8, to which the bolt 6a (6b) is fixed, is provided in the cooler 3b located opposite to the coolant holes 5a, 5b (in other words, at ends of the second flow paths 13).

Figure 3:
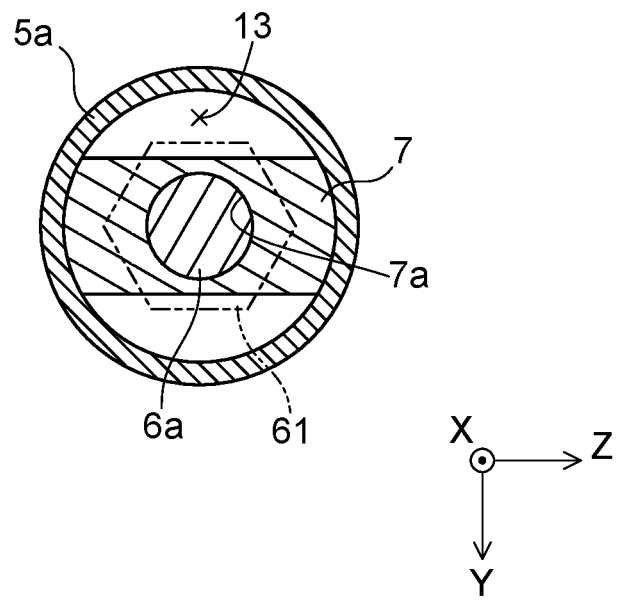
FIG. 3 is a cross-sectional view taken along a line III-III in FIG. 2.

FIG. 3 shows a cross section taken along a line III-III in FIG. 2, namely, a cross section of one of the bolt-head retainers 7. The bolt-head retainer 7 has its both ends jointed to an inner side of the coolant hole 5a. In the view along the X direction in the drawings (i.e., in the view along the stacking direction), a gap is ensured between the bolt-head retainer 7 and an inner surface of the coolant hole 5a. In other words, the bolt-head retainer 7 does not close the second flow path 13. In other words, the coolant can pass over the bolt-head retainer 7.

The bolt-head retainer 7 is provided with a through hole 7a through which the bolt 6a is inserted. FIG. 3 depicts the head 61 of the bolt 6a by an imaginary line. As shown in FIG. 3, the through hole 7a is smaller than the head 61. Therefore, the head 61 of the bolt 6a that has passed through the through hole 7a is retained by the bolt-head retainer 7. The bolt-head retainer 7 is constituted of a metal such as aluminum or copper, and is joined to the inner surface of the coolant hole 5a by welding.

Figure 4:
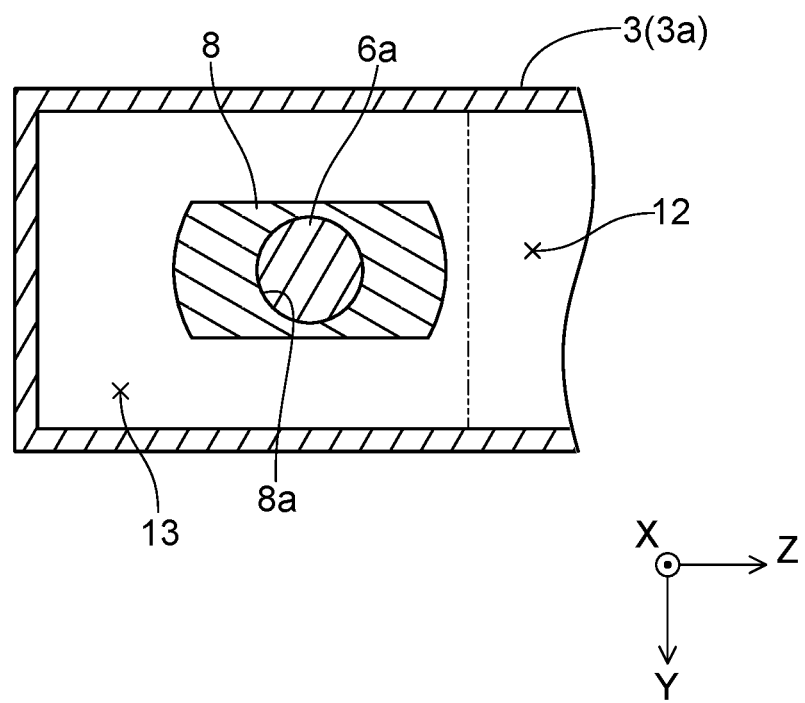
FIG. 4 is a cross-sectional view taken along a line IV-IV in FIG. 2.

FIG. 4 shows a cross section taken along a line IV-IV in FIG. 2, namely, a cross section of one of the internally threaded portions 8. The internally threaded portion 8 includes an internally threaded hole 8a provided with an internally threaded groove. The bolt 6a is fixed to the internally threaded hole 8a. As shown in FIG. 4, the second flow path 13 and the first flow path 12 are linked through a lateral side of the internally threaded portion 8. A chain double-dashed line in FIG. 4 indicates a boundary (a boundary merely for convenience sake) between the first flow path 12 and the second flow path 13. The internally threaded portion 8 is constituted of a metal such as aluminum or copper, and is joined to an inner surface of the cooler 3b by welding.

The bolt 6a is entirely accommodated in the second flow path 13 by the bolt-head retainer 7 and the internally threaded portion 8 which, are located in the second flow path 13. Therefore, there is no need to provide a space for the bolt outside the coolers 3, and there is no need to provide a sealing structure dedicated to the bolt 6a.

The coolers 3 between the head 61 retained at the bolt-head retainer 7 and the internally threaded portion 8 to which the bolt 6a (6b) is fixed are tightened by the bolt 6a (6b). This tightening force presses the coolers 3 and the semiconductor modules 30, and brings the coolers 3 and the semiconductor modules 30 into contact strongly with one another.

Figure 5:
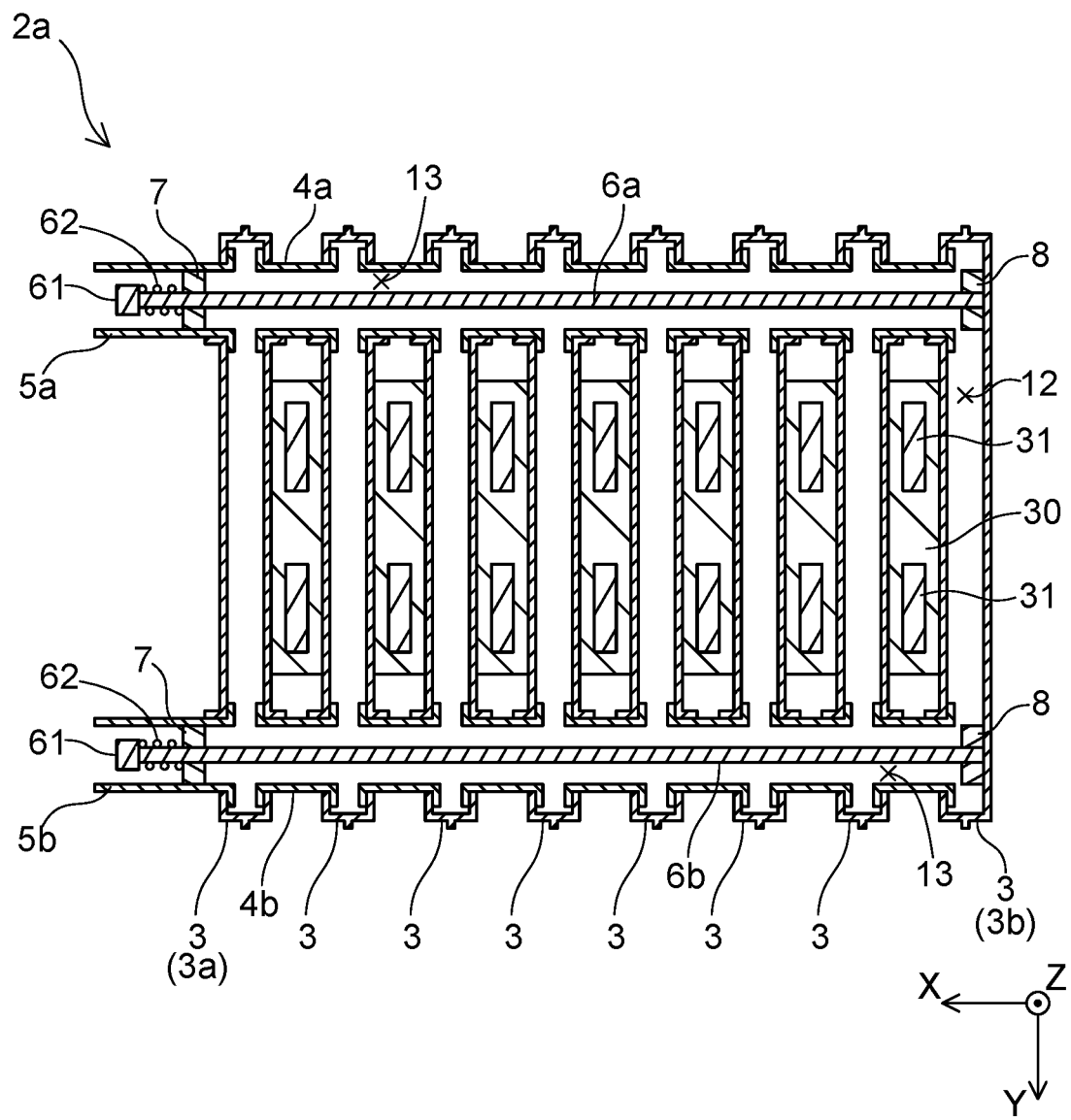
FIG. 5 is a cross-sectional view of a semiconductor device in a first variant.

(First Variant) FIG. 5 shows a cross-sectional view of a semiconductor device 2a in a first variant. In the semiconductor device 2a, a compressed spring 62 is interposed between each of the bolt-head retainers 7 and corresponding one of the heads 61 of the bolts 6a, 6b. The compressed spring 62 applies load on the head 61 toward the coolant hole 5a (5b). The load of the compressed spring 62 pushes the bolt-head retainer 7 toward the internally threaded portion 8. Consequently, the coolers 3 between the bolt-head retainers 7 and the internally threaded portions 8 are pressed in the stacking direction. Even when the bolt 6a (6b) is somewhat loosened, the compressed spring 62 can maintain the force to press the plurality of coolers 3 in the stacking direction.

Figure 6:
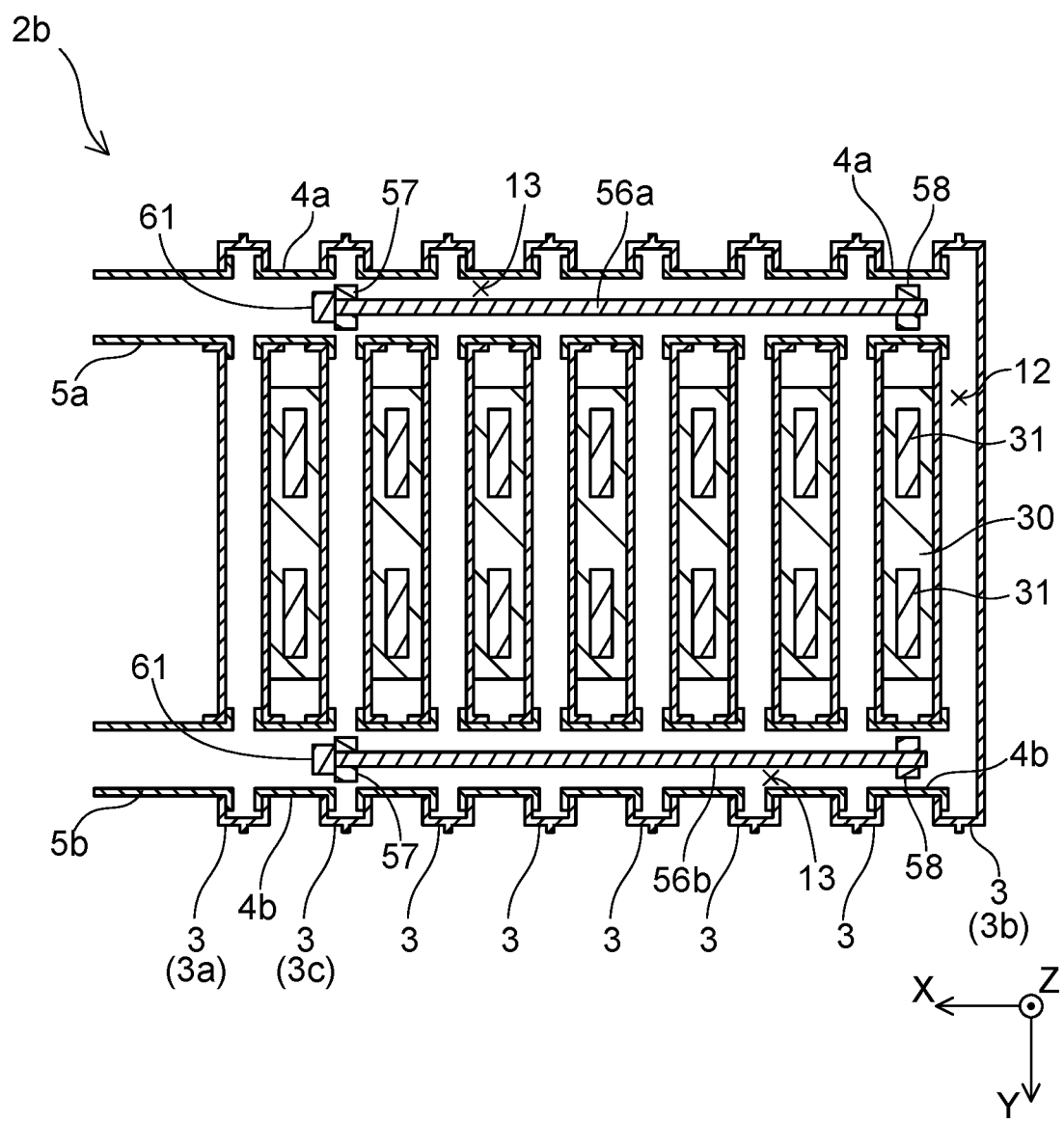
FIG. 6 is a cross-sectional view of a semiconductor device in a second variant.

(Second Variant) FIG. 6 shows a cross-sectional view of a semiconductor device 2b in a second variant. In the semiconductor device 2 in the embodiment, all of the stacked coolers 3 are fixed to each other by the bolts 6a, 6b. In the semiconductor device 2b in the second variant, some of the coolers 3 are fixed by the bolts.

The semiconductor device 2b includes bolt-head retainers 57 in the cooler 3c that is next to the cooler 3a located at the left end. Moreover, the semiconductor device 2b includes internally threaded portions 58 respectively in the connecting pipes 4a, 4b connected to the cooler 3b located at the right end. Neither the bolt-head retainers 57 nor the internally threaded portions 58 closes the second flow paths 13.

Each of bolts 56a, 56b has its head 61 retained by its corresponding bolt-head retainer 57 and has its tip fixed to the internally threaded portion 58. When the bolts 56a, 56b are tightened, the coolers 3 located between the bolt-head retainers 57 and the internally threaded portions 58 (i.e., the coolers 3 except for the coolers 3a, 3b) are pressed in the stacking direction, and the coolers 3 and the semiconductor modules 30 are brought into intimate contact with one another. In this semiconductor device 2b, the coolers 3 except for the coolers 3a, 3b are fixed to each other by the bolts 56a, 56b. The coolers 3a, 3b may be pressed by another means.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
a plurality of coolers arranged in a line, each of the coolers including a first flow path;
semiconductor modules, each of the semiconductor modules being interposed between a corresponding pair of the coolers adjacent to each other; and
a pair of connecting pipes, each of the pair of connecting pipes communicating with the coolers adjacent to each other, the pair of connecting pipes located respectively at both sides of the semiconductor modules in a direction intersecting a stacking direction of the coolers and the semiconductor modules,
wherein
a pair of coolant holes is provided at one of the coolers located at one end in the stacking direction,
each of the coolant holes overlaps corresponding one of the pair of the connecting pipes in a view along the stacking direction,
a pair of second flow paths inside the pair of connecting pipes and the coolers, the pair of second flow paths extending respectively from the coolant holes to one of the coolers located at another end in the stacking direction,
a bolt-head retainer and an internally threaded portion are provided inside each of the second flow paths, the bolt-head retainer retaining a head of a bolt, and the internally threaded portion fixing the bolt, and the coolers between the bolt-head retainers and the internally threaded portions are fixed by the bolts.

2. The semiconductor device of claim 1, wherein all of the coolers are fixed by the bolts.

3. The semiconductor device of claim 1, wherein a compressed spring is interposed between each of the bolt-head retainers and corresponding one of the heads of the bolts.

* * * * *